United States Patent
Hiratsuka et al.

(10) Patent No.: US 7,646,598 B2
(45) Date of Patent: *Jan. 12, 2010

(54) ELECTRONIC DEVICE AND HOUSING

(75) Inventors: Yoshiaki Hiratsuka, Kanagawa (JP); Nobukazu Yokomizo, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/153,480

(22) Filed: May 20, 2008

(65) Prior Publication Data
US 2008/0225477 A1 Sep. 18, 2008

Related U.S. Application Data

(62) Division of application No. 11/080,640, filed on Mar. 16, 2005, now Pat. No. 7,433,184.

(30) Foreign Application Priority Data

Dec. 24, 2004 (JP) ............................. 2004-373657

(51) Int. Cl.
*H05K 7/04* (2006.01)
(52) U.S. Cl. ..................... 361/679.4; 361/816; 361/818; 174/35 R; 174/35 GC
(58) Field of Classification Search ................ 361/686, 361/679.4, 816, 818; 174/35 R, 35 GC
See application file for complete search history.

(56) References Cited

U.S. PATENT DOCUMENTS

| 4,667,266 | A |   | 5/1987  | Masuoka et al. |
|-----------|---|---|---------|----------------|
| 5,335,137 | A |   | 8/1994  | English et al. |
| 6,043,989 | A |   | 3/2000  | Hayakawa et al. |
| 6,093,039 | A |   | 7/2000  | Lord |
| 6,160,719 | A | * | 12/2000 | May et al. ............ 361/816 |
| 6,323,445 | B1 |  | 11/2001 | Yee |
| 6,421,221 | B1 |  | 7/2002  | Thomason et al. |

(Continued)

FOREIGN PATENT DOCUMENTS

CN 2603536 Y 2/2004

(Continued)

OTHER PUBLICATIONS

Japanese Office Action dated Jul. 1, 2008, Application No. 2004-373657.

(Continued)

*Primary Examiner*—Jayprakash N Gandhi
*Assistant Examiner*—Ingrid Wright
(74) *Attorney, Agent, or Firm*—Westerman, Hattori, Daniels & Adrian, LLP

(57) ABSTRACT

The invention provides an electronic device that is environment-friendly and capable of achieving satisfactory noise prevention effect at low cost, and a housing implementing such electronic device. The housing has an electronic circuit disposed therein, and includes a component exposure section in which part of a conductive component disposed in the housing is exposed outward, a plate section made of a conductive material having a predetermined thickness, and spreading at a distance from the component exposure section, and a bridge section with the overall thickness thereof larger than the thickness of the plate section, extending along the component exposure section and electrically connecting the plate section and the conductive component.

6 Claims, 12 Drawing Sheets

U.S. PATENT DOCUMENTS

| | | | |
|---|---|---|---|
| 6,958,445 B1 * | 10/2005 | Boudreaux et al. | 174/359 |
| 6,984,136 B2 | 1/2006 | Yu | |
| 2004/0172146 A1 | 9/2004 | Schneider et al. | |
| 2004/0257727 A1 | 12/2004 | Chu | |
| 2006/0158858 A1 | 7/2006 | Wakabayashi et al. | |

FOREIGN PATENT DOCUMENTS

| | | |
|---|---|---|
| EP | 0 328 077 B1 | 8/1989 |
| JP | 07-231190 | 8/1995 |
| JP | 07-245492 | 9/1995 |
| JP | 10-075082 | 3/1998 |
| JP | 2001-308574 | 11/2001 |
| JP | 2002-117949 | 4/2002 |
| WO | 93/10650 | 5/1993 |
| WO | 98/21693 | 5/1998 |

OTHER PUBLICATIONS

German Office Action dated Nov. 18, 2005, German Application No. 10 2005 011 537.3-54.
Chinese Office Action dated May 11, 2007, Application No. 200510065124.9.
Japanese Office Action dated Jun. 26, 2007, Application No. 2007-087333.
Japanese Office Action dated Nov. 20, 2007, Application No. 2007-087333.
German Office Action dated Nov. 18, 2005, German Application No. 10 2005 011 537.3-54.
Chinese Office Action dated May 11, 2007, Application No. 200510065124.9.
Japanese Office Action dated Jun. 26, 2007, Application No. 2007-087333.
Japanese Office Action dated Nov. 20, 2007, Application No. 2007-087333.

* cited by examiner

ELECTRONIC DEVICE AND HOUSING

CROSS-REFERENCE TO RELATED APPLICATION

This application is a Divisional of application Ser. No. 11/080,640, filed on Mar. 16, 2005, the entire contents of which are incorporated herein by reference.

BACKGROUND OF THE INVENTION

1. Field of the Invention

The present invention relates to an electronic device having an electronic circuit incorporated therein, and to a housing for the same.

2. Description of the Related Art

In recent years, as the number of kinds of accessible peripheral devices is growing, note-type personal computers (hereinafter referred to as a note PC, for short) being a type of electronic device with built-in electronic circuits have become more convenient. Accordingly, the kind and number of ports (connectors) used to connect to the peripheral devices are being required to be increased. However, due to restricted mounting space, it is difficult to mount many connectors of various kinds all at once on a note PC itself. Thus, generally, each maker employs a connection configuration such that a separate unit having many connectors of various kinds mounted thereon is provided, and that the separate unit is detachably connected via a dedicated connector to the note PC. In many cases, in view of the wiring on the printed board and of the usability of other units and the note PC, the dedicated connector is mounted on the bottom face in the vicinity of the rear end of the note PC. When the dedicated connector is mounted on such a location, the bottom face of the housing of the note PC must be bored to mount the connector.

As a material for the bottom face side of the housing of the note PC, there is employed a metal plate-like member for the purposes, such as increasing the strength of a housing and securing the escape path for static electricity. Thus, a boring for mounting the connector is to be positioned around the end of the plate-like member. Also, at the rear end of the note PC, connectors, etc., are protruded outward from the housing, and the shell (metal outer shell section) of the connector is installed in the vicinity of the boring of the plate-like member.

In a note PC having such a structure, it is known that, when static electricity is applied to the shell of connector by the user's body coming close to the shell or by other actions, due to the static electricity, there are generated noises which cause the electronic circuit of the note PC to malfunction.

As a measure against such noises, there have been proposed a technique of plating the inner face of a plastic member constituting the outermost shell of a housing to thereby allow static electricity to escape to the plating film, and a technique of disposing a radiowave absorption sheet inside the housing to thereby prevent noises from entering the electronic circuit (refer to Japanese Patent Laid-Open No. 2001-308574, for example).

The hitherto proposed techniques, however, can pose problems, such as increasing the cost of note PCs, and hindering weight saving and reduction in thickness which are strongly requested of note PCs. In addition, in recent years, while reduction of adverse environmental effects as introduced when electronic devices are scrapped is strongly requested, the application of plating and radiowave absorption sheet can bring about significant adverse environmental effects.

These problems are posed not only by note PCs, but generally also by various electronic devices of which a noise countermeasure are requested.

SUMMARY OF THE INVENTION

The present invention has been made in view of the above circumstances and provides an electronic device that is environment-friendly and capable of achieving satisfactory noise prevention effect at low cost, and a housing which can implement such electronic device.

An electronic device according to the invention includes an electronic circuit; a housing having the electronic circuit disposed therein; and a conductive component disposed in the housing and having part thereof exposed outside the housing, wherein the housing includes a component exposure section in which the conductive component is exposed outward, a plate section made of a conductive material having a predetermined thickness and spreading at a distance from the component exposure section, and a bridge section with the overall thickness thereof larger than the thickness of the plate section, extending along the component exposure section and electrically connecting the plate section and the conductive component.

Here, the bridge section may be composed of plural overlapping members, or alternatively may be a single member.

The electronic device according to the invention has a structure in which the overall thickness of the bridge section is larger than the thickness of the plate section. Thus, even when static electricity is applied to a conductive component as typified by a connector component, the static electricity is allowed to rapidly escape through the bridge section to the plate section, thereby suppressing the generation itself of noises to achieve a large noise prevention effect. This structure is based on a hitherto unknown detailed analysis regarding noise generation principle, which will be later described in detail. Due to the simplicity and large effect implemented by the structure, the electronic devices can be small and of low cost. In addition, while avoiding the use of materials bringing about significant adverse environmental effects, such as plating and radiowave absorption sheet, the simple structure of the electronic device according to the invention can be easily realized with a metal plate or the like hardly causing adverse environmental effects.

The bridge section preferably includes a first section formed of the conductive material integrally with the plate section, and a second section overlapping and contacting the first section. In addition, the bridge section preferably includes a first section formed of the conductive material integrally with the plate section, and a second section overlapping and contacting the first section via a board spring.

The bridge section having the first and second sections of this type can be easily formed. Also, the configuration in which the second section contacts via a board spring the first section has high contact stability. Consequently, the noise prevention effect can be sufficiently maintained even under severe environments, such as one with vibrations applied.

A housing according to the invention, having an electronic circuit disposed therein, includes a component exposure section in which part of a conductive component disposed in the housing is exposed outward, a plate section made of a conductive material having a predetermined thickness, and spreading at a distance from the component exposure section, and a bridge section with the overall thickness thereof larger than the thickness of the plate section, extending along the component exposure section and electrically connecting the plate section and the conductive component.

By employing the housing according to the invention, the above-described electronic device according to the invention can be implemented.

Regarding the housing of the invention, only its basic configuration will be shown here so that repeated explanation thereof is omitted. Not only the basic configuration but various configurations of the housing corresponding to the above described respective configurations of the electronic device are included in the scope of the invention.

As described above, according to the invention, the electronic device being environment-friendly and capable of achieving satisfactory noise prevention effect at low cost can be implemented.

DETAILED DESCRIPTION OF THE PREFERRED EMBODIMENTS

Embodiments of the invention will be described below with reference to the drawings.

Figure 1:
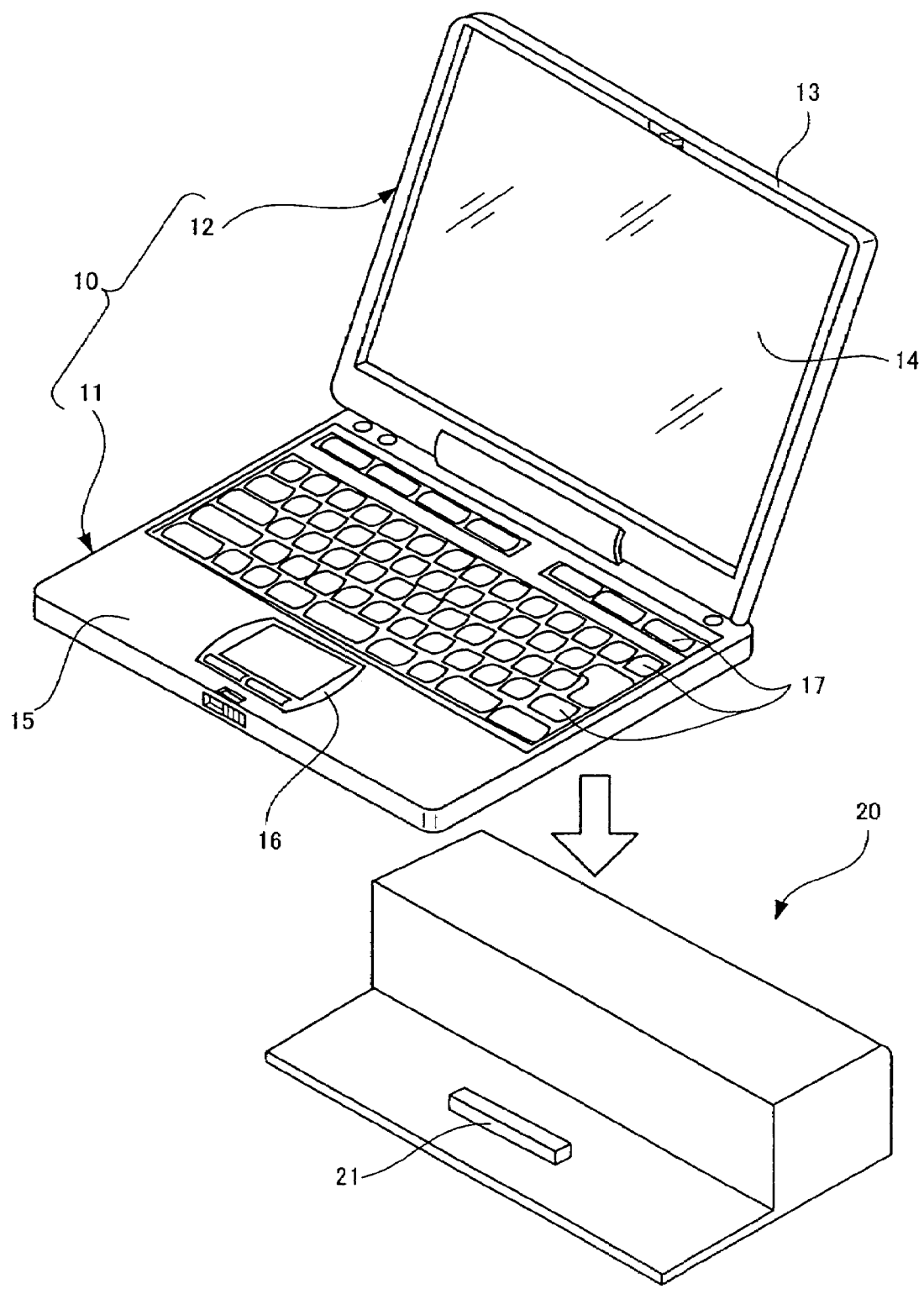
FIG. 1 is a diagram showing one embodiment of the invention.

FIG. 1 is a diagram showing one embodiment of the invention.

In FIG. 1, a note-type personal computer (note PC) 10 corresponding to one embodiment of the invention is illustrated. The note PC 10 includes a main body 11 and an upper cover 12 that is openable and closable relative to the main body 11. The upper cover 12 is constructed by incorporating a liquid crystal screen 14 into an upper cover side housing 13. The main body 11 is constructed by incorporating a pointing device 16 and keys of various kinds 17 into a main body side housing 15, and incorporating printed boards, semiconductor elements, storage devices, etc. into the interior section of the main body side housing 15. Also, as described later, various connectors are exposed outward from the rear side of the main body side housing 15.

The note PC 10 is detachable relative to a separate unit 20, and is connected via a dedicated connector 21 to the separate unit 20.

Figure 2:
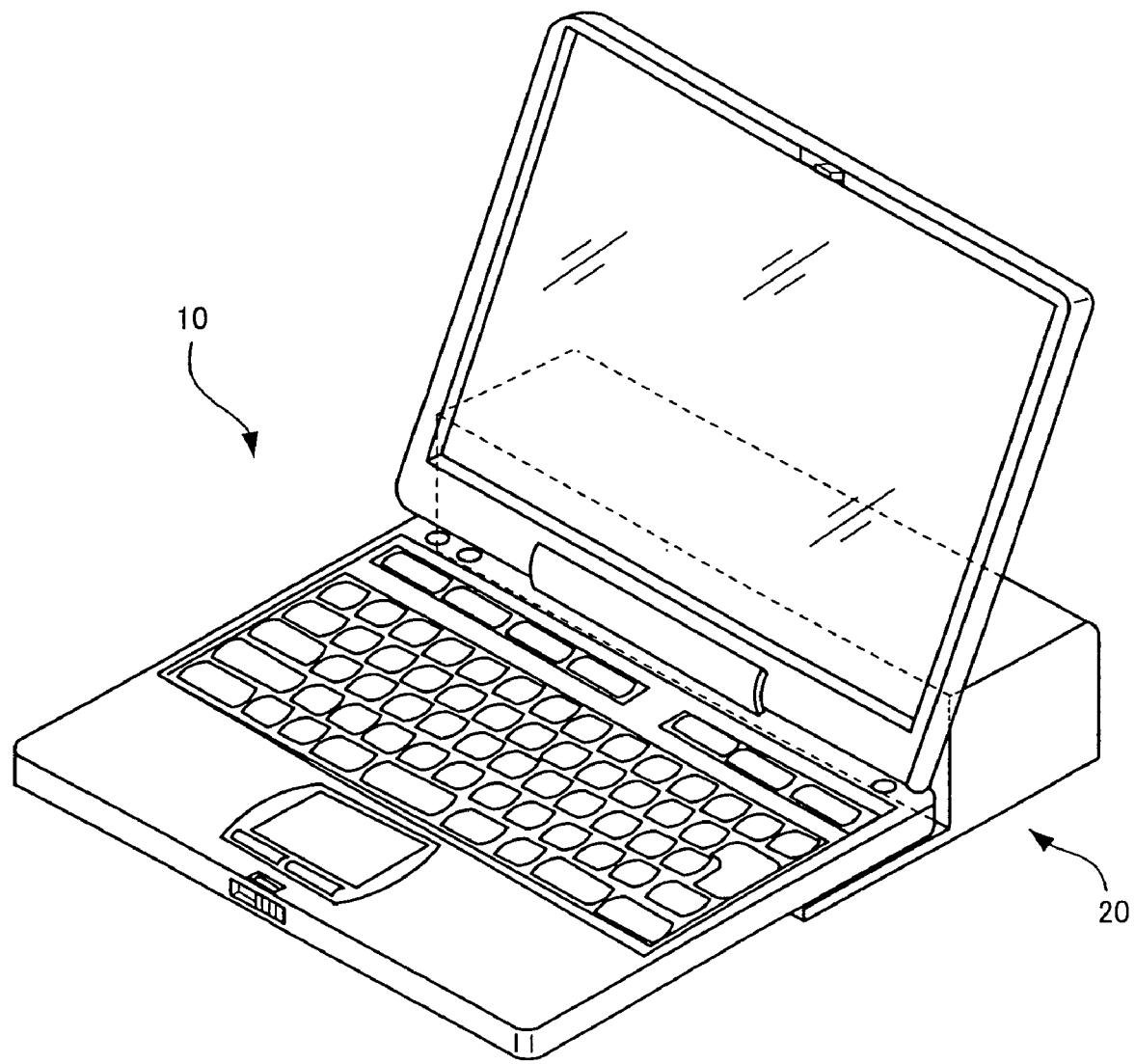
FIG. 2 is a diagram showing a note PC connected to a separate unit.

FIG. 2 is a diagram showing the note PC 10 connected to the separate unit 20.

The separate unit 20 is provided with many connectors of various standards for peripheral device so that various peripheral devices, such as a display, a printer, an external storage device and a communication unit, can be connected thereto. The note PC 10 can access these peripheral devices of various kinds via the separate unit 20.

It is desired that the note PC 10 on its own can be connected to some peripheral devices. Thus, various connectors for peripheral device are also provided on the rear side of the note PC 10.

Figure 3:
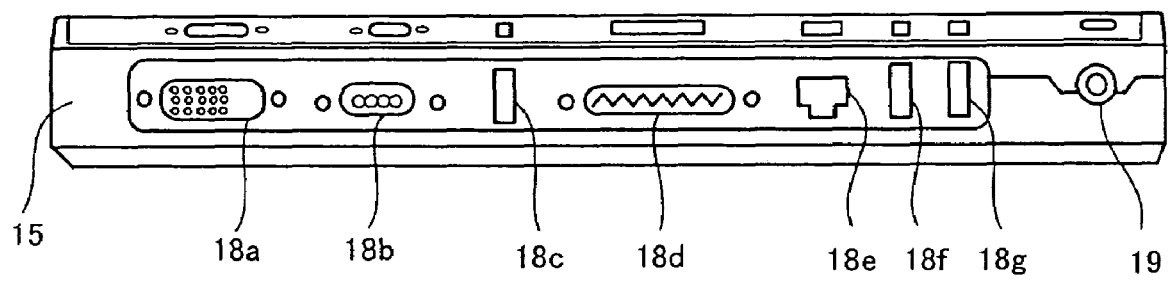
FIG. 3 is a diagram showing the rear side of the note PC.

FIG. 3 is a diagram showing the rear side of the note PC 10.

In the note PC 10, as the connectors for peripheral device, there are incorporated an output terminal 18$a$ of a first kind for external display, an output terminal 18$b$ of a second kind for external display, three USB connectors 18$c$, 18$f$ and 18$g$, a printer port 18$d$, and a network connector 18$e$, which are exposed outward from the rear side of the main body side housing 15. In addition, on the rear side of the main body side housing 15, there is also provided a power source input terminal 19 which supplies the electrical power to the note PC 10.

Of various connectors shown here, two kinds of output terminals 18$a$ and 18$b$ and a printer port 18$d$ for external display are exposed outward from the main body side housing 15; the outer shell section (shell) of these connectors is made of metal. The connector with such shell corresponds to one example of the conductive component according to the invention; the rear side of the main body side housing 15 corresponds to one example of the component exposure section according to the invention.

The internal structure of the main body side housing 15 will now be described.

Figure 4:
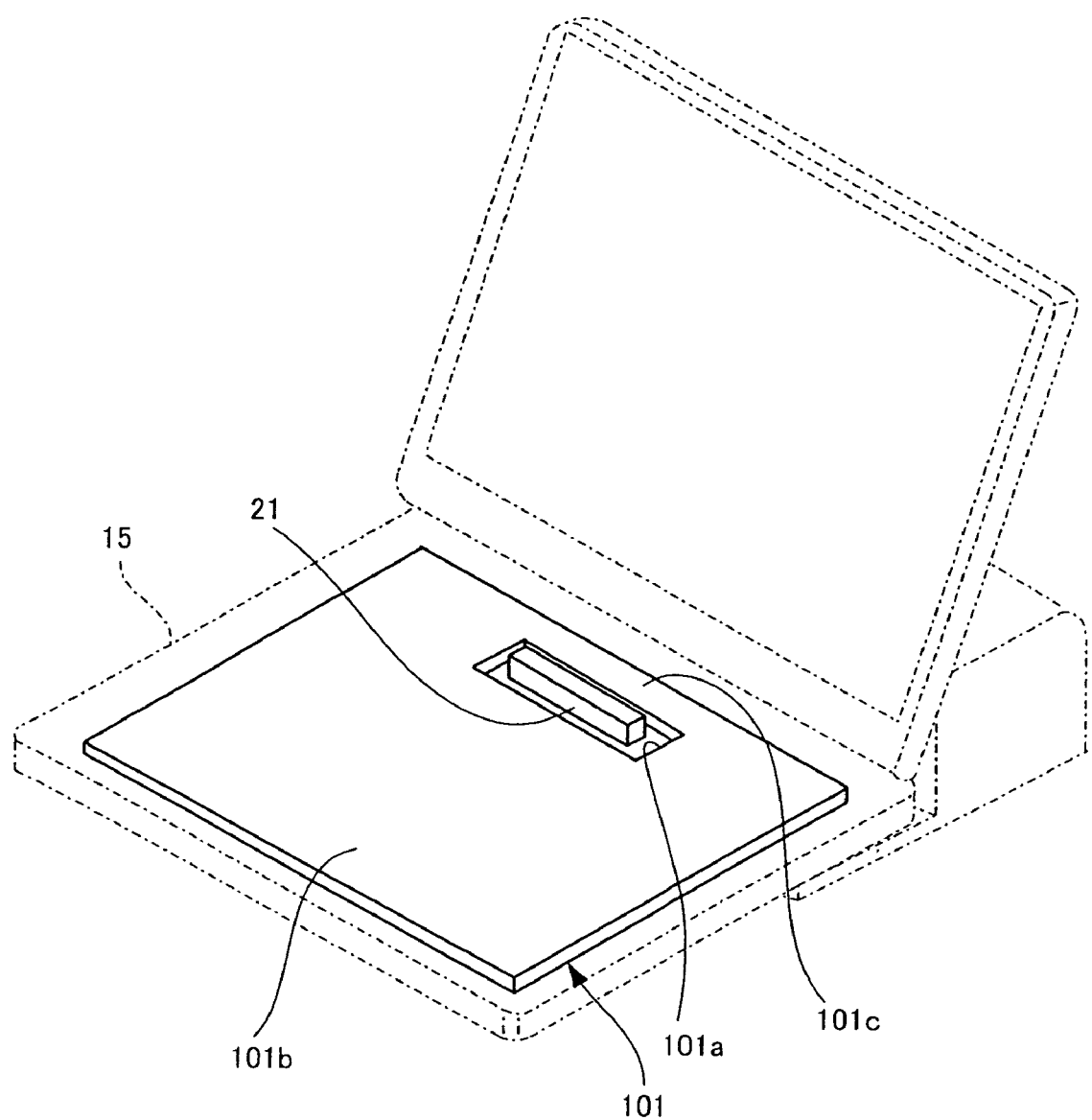
FIG. 4 is a first explanatory diagram to describe the internal structure of a main body side housing.
Figure 5:
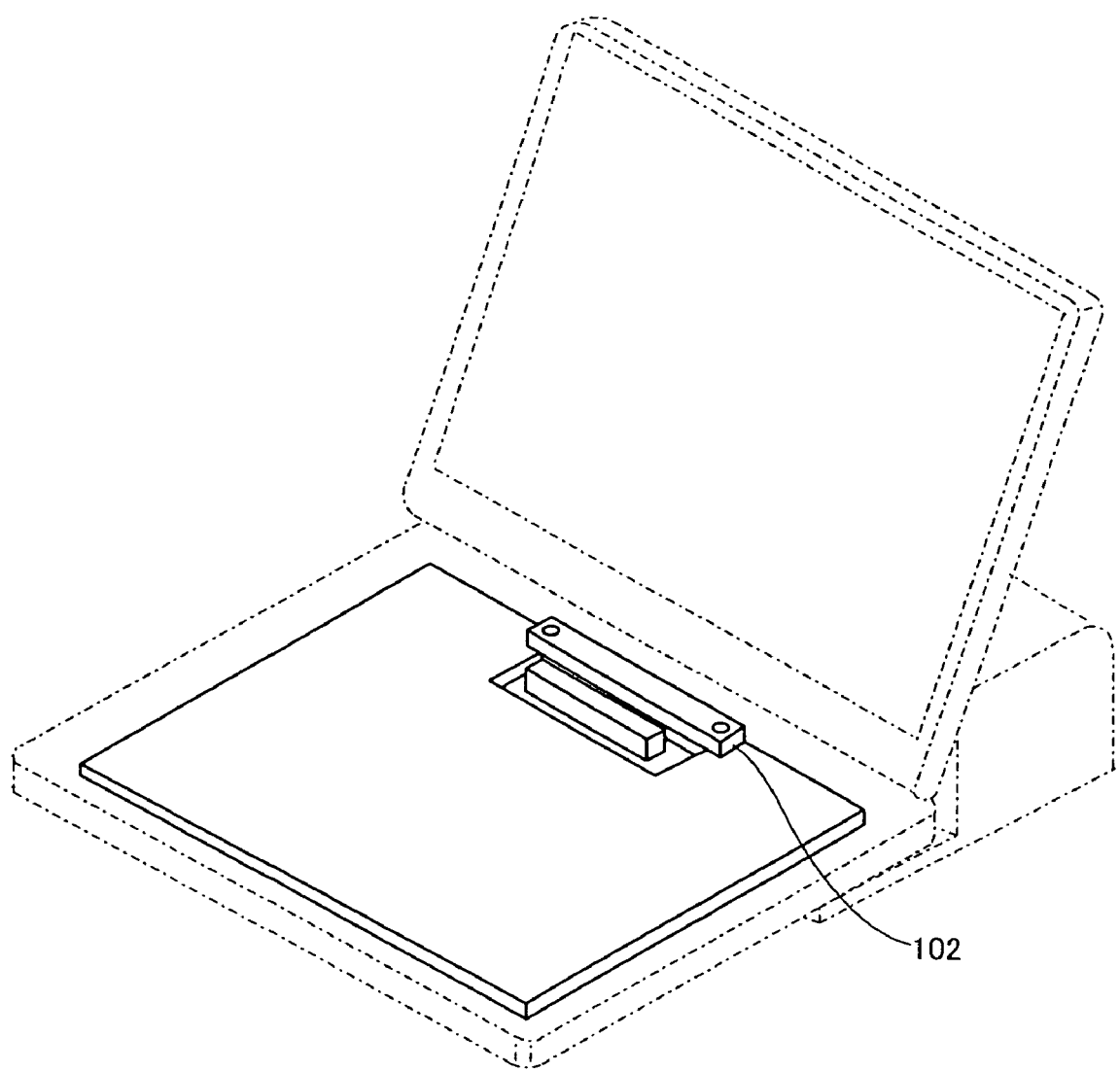
FIG. 5 is a second explanatory diagram to describe the internal structure of the main body side housing.

FIGS. 4 and 5 are explanatory diagrams to describe the internal structure of the main body side housing 15.

On the bottom face side of the interior section of the main body side housing 15, there is incorporated a plate-like member 101 formed by processing a metal plate. The plate-like member 101 has a boring 101$a$ so that a connector 21 penetrates. Due to the presence of this boring 101$a$, the plate-like member 101 includes a large and wide plate section 101$b$ and a slim bottleneck section 101$c$. In addition, as shown in FIG. 5, on the bottleneck section 101$c$, there is overlapped and fastened a slim metal member 102 used for noise countermeasure. The plate section 101$b$ of the plate-like member 101 corresponds to one example of the plate section according to the invention; the bottleneck section 101$c$ and metal member 102 corresponds to one example of the first and second sections of the bridge section according to the invention, respectively.

According to the embodiment, as a method for fastening the bottleneck section 101$c$ to the metal member 102, fastening with caulking is employed. According to the invention, however, fastening with screw, etc. can also be alternatively employed. Furthermore, according to the invention, the bottleneck section 101$c$ and the metal member 102 may be electrically integrated by joining them with an adhesive, two-sided tape, conductive tape or the like, instead of with fastening, or alternatively may be physically and electrically integrated with welding.

The metal shells of the connectors shown in FIG. 3 are electrically connected to both the bottleneck section 101$c$ and the metal member 102.

Hereinafter, an operation of the noise countermeasure according to the embodiment will be described. Before the description of the operation, firstly a detailed analysis on the noise generation principle and a comparative example to which a conventional noise countermeasure is applied will be described, and then the operation of the noise countermeasure according to the embodiment will be described.

Figure 6:
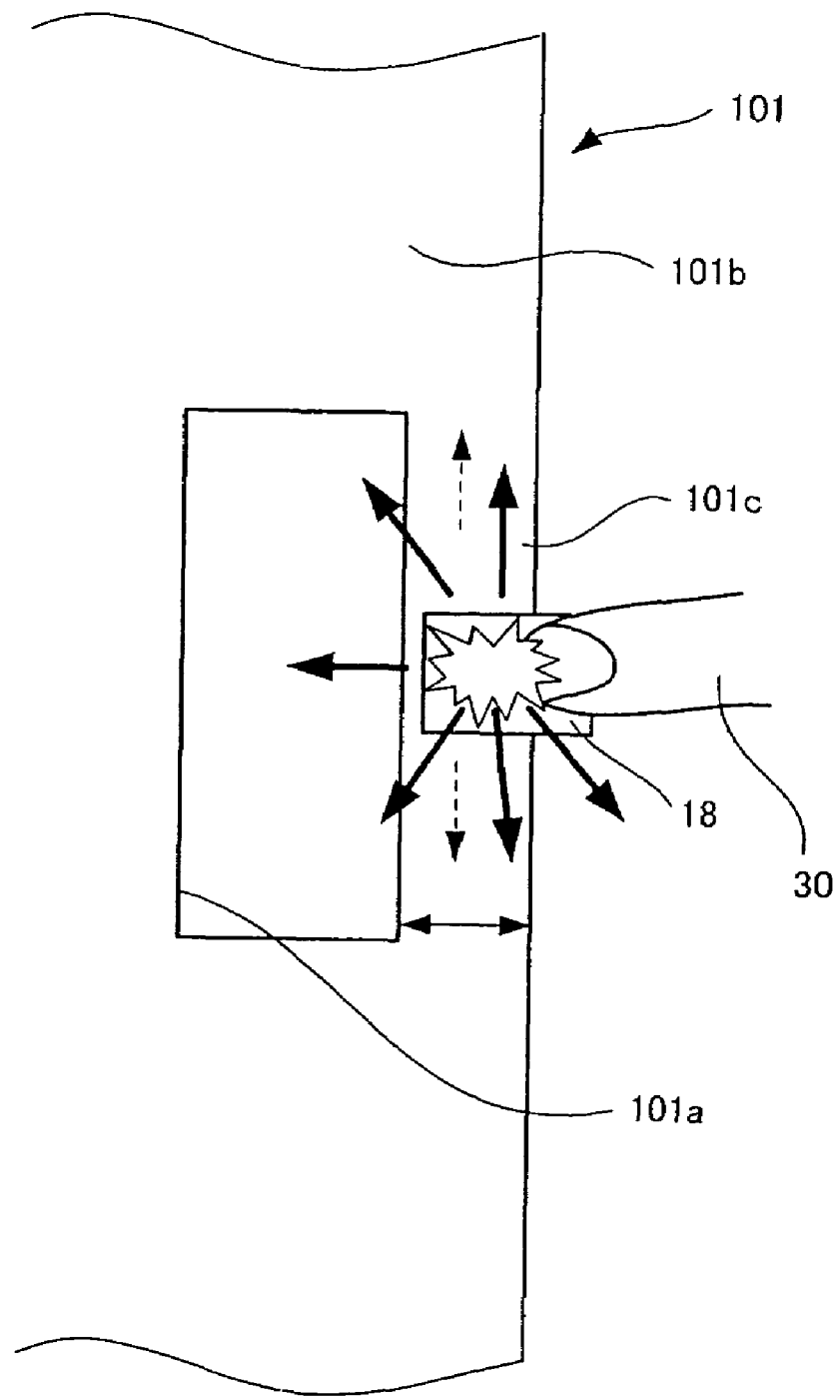
FIG. 6 is a first explanatory diagram to describe the noise generation principle.
Figure 7:
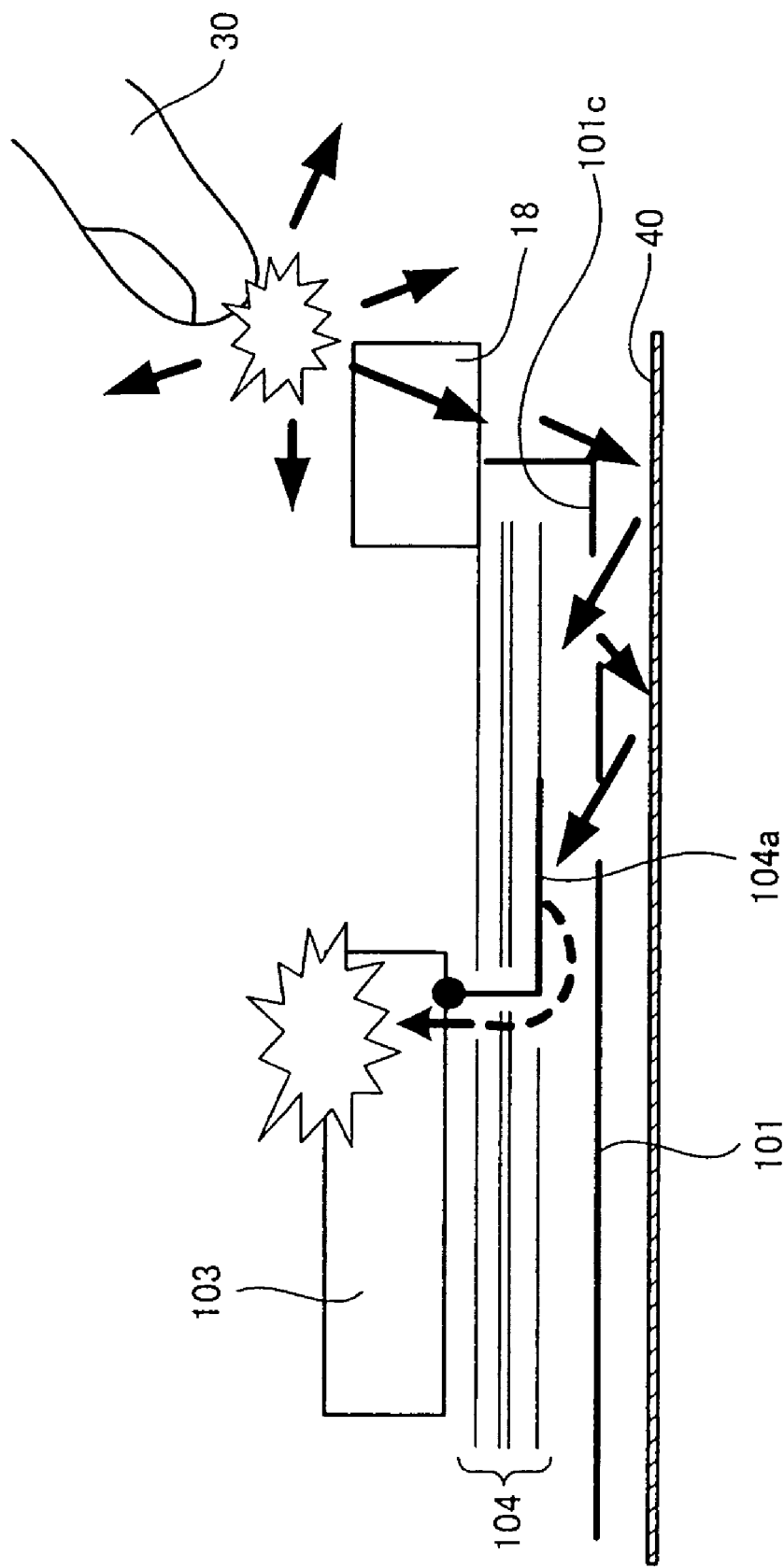
FIG. 7 is a second explanatory diagram to describe the noise generation principle.

FIGS. 6 and 7 are explanatory diagrams to describe the noise generation principle. These diagrams are not intended to illustrate the above described embodiment. However, the same reference numerals are applied to elements corresponding to FIGS. 4 and 5, and an explanation thereof is omitted.

In FIGS. 6 and 7, there is shown a case where a note PC having no noise countermeasure applied thereto is placed on a steel desk 40. In addition, a connector shell 18 electrically connected to a bottleneck section 101c of a plate-like member 101, and a semiconductor element 103 and printed board 104 each provided in the interior section of the note PC are also shown. The connector is mounted on the printed board 104.

When a finger 30, etc. of the user comes close to the connector shell 18, static electricity accumulated in the user's body can be discharged and applied to the connector shell 18. The static electricity is apt to flow through the bottleneck section 101c to the plate section 101b. However, the presence of a boring 101a makes the impedance of the bottleneck section 101c large, thus interrupting the flow of the electrical current.

According to an analysis by the inventors, etc, it is evident that, at this time, two kinds of noises, i.e. conduction noise traveling through conductive material and radiation noise radiated into the air are generated. As described below, it is clear that, of the two kinds of noises, the malfunction of the semiconductor element 103 is caused by the radiation noise.

Specifically, when static electricity is discharged from the user's finger 30, conduction noise and radiation noise are simultaneously generated. When the energy of conduction noise is compared with that of radiation noise, the energy of the radiation noise is larger than that of the conduction noise because the impedance of the bottleneck section 101c is large. Then, the radiation noise travels through a space between the steel desk 40 and plate-like member 101 while being repeatedly reflected, and proceeds through the opening section, gaps, etc. of the plate-like member 101 into the interior section of the note PC. After entering the interior section of the note PC, with a metal pattern 104a provided as the signal pattern and power source pattern on the printed board 104 functioning as an antenna, the radiation noise travels to the semiconductor element 103, thus causing the malfunction of the semiconductor element 103.

The noise generation principle like this has hitherto been unknown. Consequently, as a noise countermeasure, an idea that an electronic circuit be covered with a conductive shield has prevailed.

A comparative example to which a noise countermeasure based on such conventional idea is applied will now be described.

Figure 8:
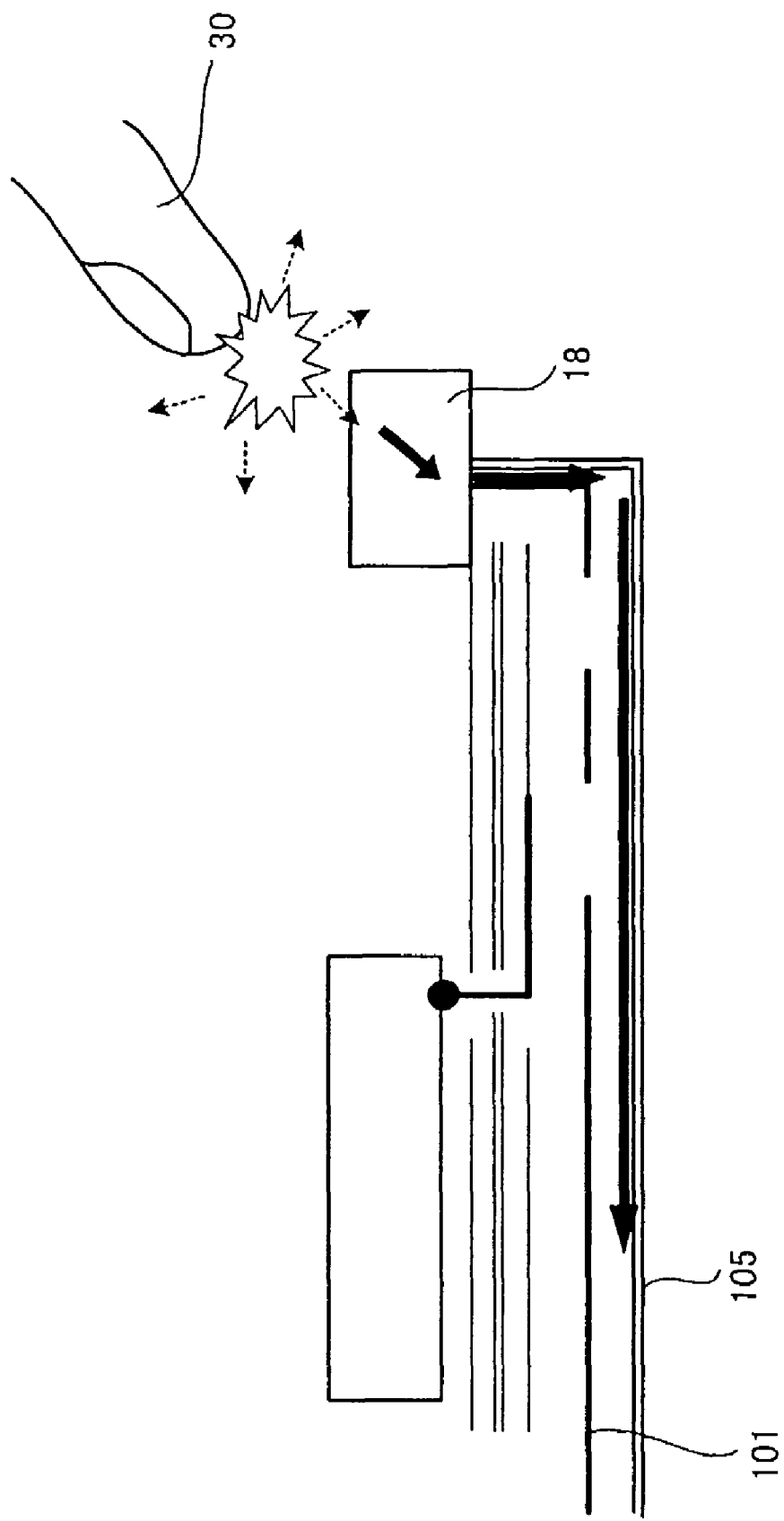
FIG. 8 is a diagram showing a comparative example to which a conventional noise countermeasure is applied.

FIG. 8 is a diagram showing a comparative example to which the conventional noise countermeasure is applied. Also in FIG. 8, the same reference numerals are applied to elements corresponding to each of the drawings used in the above descriptions, and an explanation thereof is omitted.

In the comparative example shown in FIG. 8, in addition to the plate-like member 101, a housing outer shell 105 made of plastic is provided; the inner face of the housing outer shell 105 is plated; The plating film of the housing outer shell 105 electrically contacts the connector shell 18. Accordingly, static electricity applied to the shell 18 also travels through the plating film of the housing outer shell 105. Consequently, an effect of reducing radiation noise is achieved.

However, in the comparative example like this, a large plating film spreading over the inner surface of the housing outer shell 105 is needed, thus hindering downsizing of the note PC and at the same time increasing the cost. Also, the presence of such plating film brings about adverse environmental effects when the note PC is scrapped. Accordingly, it is expected that the application of the structure described in the comparative example into a note PC will soon become impossible.

In addition to the comparative example shown in FIG. 8, there is also an idea that adequate radiowave absorption sheet is spread between the housing outer shell 105 and plate-like member 101 to prevent all noises coming from the outside from entering the plate-like member 101. However, similarly to the above described comparative example, the presence of such radiowave absorption sheet also hinders downsizing and cost reduction of the note PC, and brings about adverse environmental effects.

Based on the above described noise generation principle and comparative example, an operation of the noise countermeasure according to the embodiment will be described.

Figure 9:
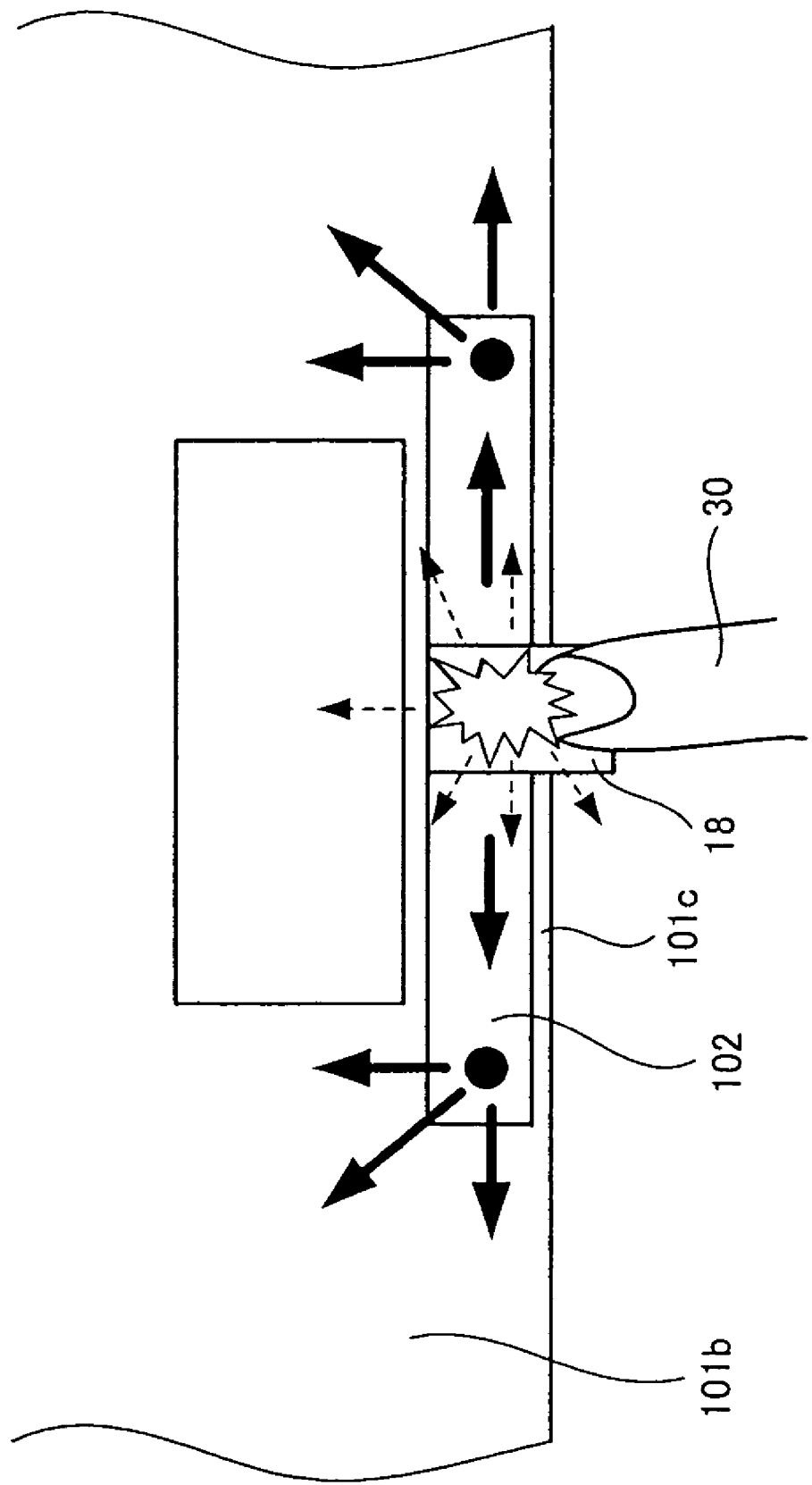
FIG. 9 is a first explanatory diagram to describe an operation of the noise countermeasure according to the embodiment of the invention.
Figure 10:
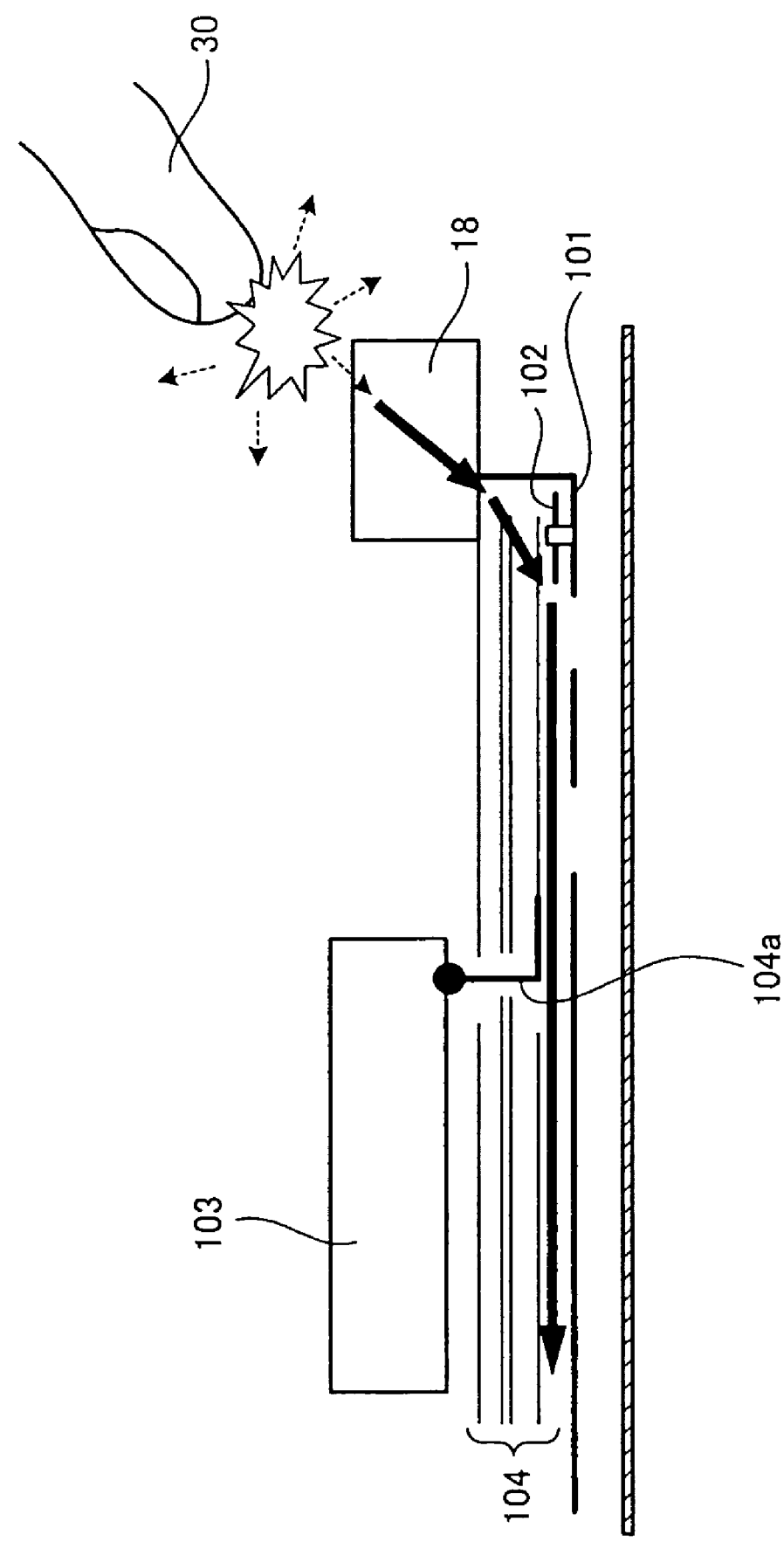
FIG. 10 is a second explanatory diagram to describe the operation of the noise countermeasure according to the embodiment of the invention.

FIGS. 9 and 10 are explanatory diagrams to describe an operation of the noise countermeasure according to the embodiment. In FIGS. 9 and 10, the same reference numerals are applied to elements corresponding to FIGS. 6 to 8.

According to the embodiment, on the bottleneck section 101c of the plate-like member 101, there is overlapped and fastened a slim metal member 102. Also, the connector shell 18 is electrically connected to both the bottleneck section 101c and metal member 102. The overall thickness obtained by combining the bottleneck section 101c and metal member 102 is larger than the thickness of the plate section 101b of the plate-like member 101; the overall impedance obtained by combining the bottleneck section 101c and metal member 102 is small. Thus, even when the user's finger 30 or the like comes close to the shell 18 to discharge static electricity, the electricity flows via each of the bottleneck section 101c and metal member 102 to the plate section 101b, thereby suppressing the noise discharged. Consequently, regarding the printed board 104 and semiconductor element 103 each incorporated in the note PC, the malfunction caused by the metal pattern 104a receiving the discharged noise can be substantially prevented. By fabricating the note PC having the structure according to the embodiment to perform a static electricity evaluation, it can be determined that static electricity resistant strength is improved by several kV relative to the conventional art, thus satisfying the level required by the strict international standards.

Also, according to the embodiment, the noise countermeasure is achieved with a very simple structure having the metal member 102 provided on the bottleneck section 101c, thereby facilitating downsizing of the note PC, and also contributing to cost reduction. In addition, similarly to the plate-like member 101, environment-friendly materials can be used for the metal member 102, which can easily reduce the impact of the note PC on environment.

Another embodiment of the invention will now be described.

Figure 11:
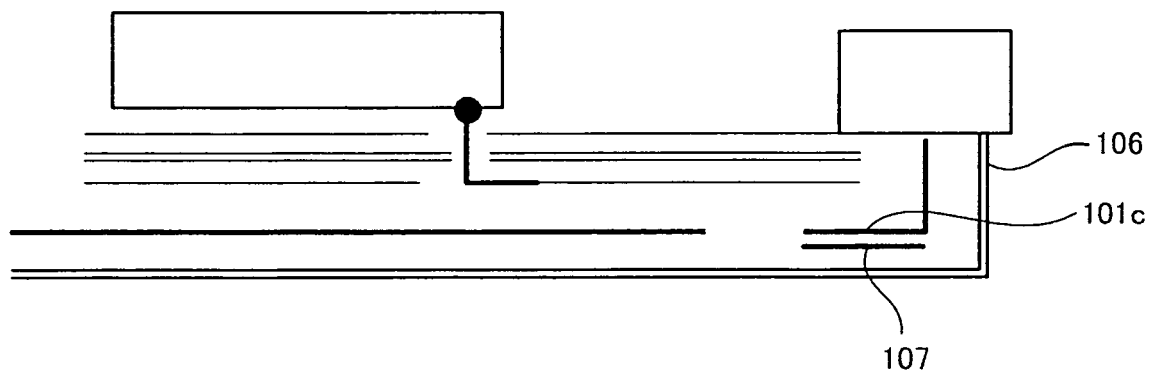
FIG. 11 is a diagram showing another embodiment of the invention.

FIG. 11 is a diagram showing another embodiment of the invention.

The another embodiment is substantially similar to the above described embodiment except that the metal member for noise countermeasure is disposed in a different location. Accordingly, the difference from the above described embodiment will be mainly described here, and repeated explanation thereof is omitted.

According to the another embodiment, a slim metal member 107 is fastened along a bottleneck section 101c to the lower side of the bottleneck section 101c, and the note PC is covered with a housing outer shell 106 made of plastic which prevents the metal member 107, etc. from being exposed.

The metal member 107 overlaps the bottleneck section 101c. The metal member 107 and bottleneck section 101c constitute another example of the bridge section according to the invention. Also in this embodiment, the overall impedance of the metal member 107 and bottleneck section 101c is small, whereby static electricity escapes rapidly through the metal member 107 and bottleneck section 101c, thus reducing radiation noise.

In this way, the radiation noise reduction effect is large irrespective of where the metal member is disposed relative to the bottleneck section 101c. However, when the metal member is loosely fastened to the bottleneck section to thereby make the contact unstable, the reduction effect is also made unstable. Therefore, it is desired that the contact between the bottleneck section and metal member is made stable.

Figure 12:
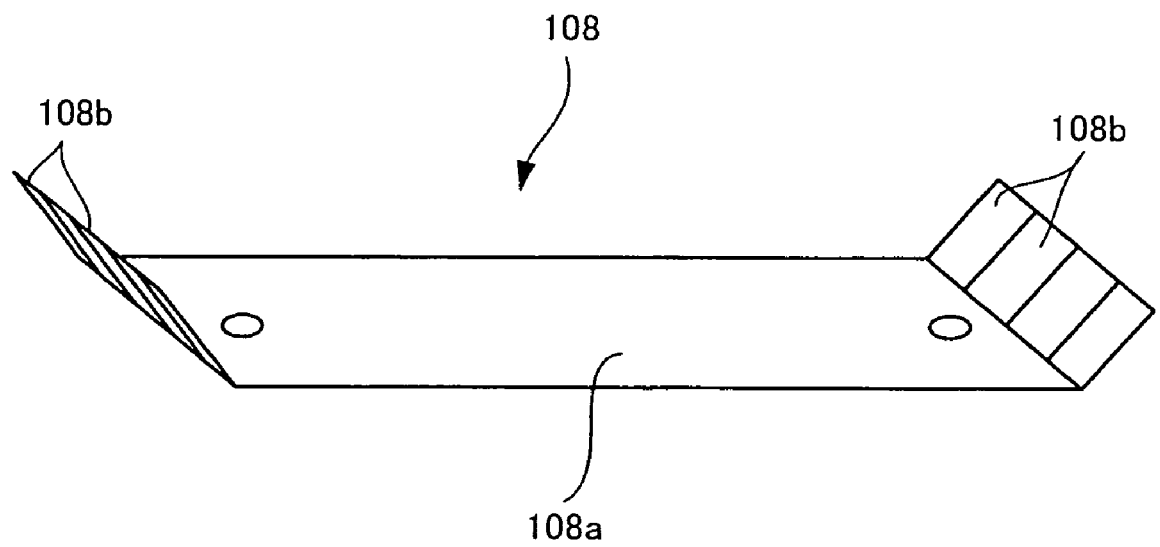
FIG. 12 is a diagram showing a metal member in which contact stabilization is achieved.

FIG. 12 is a diagram showing a metal member in which contact stabilization is achieved.

The metal member 108 shown in FIG. 12, which is used instead of the metal member 102 shown in FIGS. 5, 9, and 10, or the metal member 107 shown in FIG. 11, has a structure formed by providing a board spring section 108b at both ends of a main body 108a. The board spring section 108b like this is formed by bending at both ends a metal board out of which the metal member 108 is made, and then forming notches to divide the metal board into plural sections. The metal member 108 having such structure strongly contacts the bottleneck section with the force of the board spring section 108b, and at the same time has large contact stability. Accordingly, the radiation noise reduction effect as described above can be stably utilized for long periods even under severe environments, such as one with vibrations applied.

In the above descriptions, as one example of the bridge section according to the invention, there is shown one formed by disposing the slim metal member on the bottleneck section of the plate-like member. The bridge section according to the invention, however, may be one fabricated with a thicker material than the plate section separately from the plate section and attached to the plate section, or alternatively may be one obtained by processing a metal board in which the vicinity of the bridge section is originally thicker than the other sections of the metal board so that the bridge section is formed integrally with the plate section.

Also, in the above descriptions, as one example of the electronic device according to the invention, the note PC is shown. The electronic device according to the invention, however, may be a computer other than note-type one, or alternatively may be an electronic device other than a computer, such as an electronic measurement device.

What is claimed is:

1. An electronic device comprising:
    an electronic circuit;
    a housing having the electronic circuit disposed therein; and
    a peripheral device connector disposed in the housing and partially exposed outside the housing,
    the housing including:
    an exposure section in which the peripheral device connector is exposed outward;
    a first conductive section that is made of a conductive plate having a predetermined thickness; and
    a second conductive section that electrically connects the first conductive section to the peripheral device connector, and has an overall thickness larger than the thickness of the first conductive section,
    wherein the first conductive section has an area larger than the second conductive section, and
    wherein the second conductive section has the form of a plate.

2. The electronic device according to claim 1, wherein the second conductive section comprises:
    a first portion that is formed of a conductive material integrally with the first conductive section; and
    a second portion that contacts and overlaps the first portion.

3. The electronic device according to claim 1, wherein the second conductive section comprises:
    a first portion that is formed of a conductive material integrally with the first conductive section; and
    a second portion that includes a spring in contact with the first portion.

4. A housing having an electronic circuit disposed therein, comprising:
    an exposure section in which a peripheral device connector disposed in the housing is exposed outward;
    a first conductive section that is made of a conductive plate having a predetermined thickness and extends from the exposure section; and
    a second conductive section that electrically connects the first conductive section to the peripheral device connector, and has an overall thickness larger than the thickness of the first conductive section,
    wherein the first conductive section has an area larger than the second conductive section, and
    wherein the second conductive section has the form of a plate.

5. The housing according to claim 4, wherein the second conductive section comprises:
    a first portion that is formed of a conductive material integrally with the first conductive section; and
    a second portion that contacts and overlaps the first portion.

6. The housing according to claim 4, wherein the second conductive section comprises:
    a first portion that is formed of a conductive material integrally with the first conductive section; and
    a second portion that includes a spring in contact with the first portion.

* * * * *